United States Patent [19]

Brust

[11] Patent Number: 4,771,235

[45] Date of Patent: Sep. 13, 1988

[54] METHOD AND APPARATUS FOR DETECTING AND IMAGING MEASURING POINTS THAT HAVE A DEFINED SIGNAL PROGRESSION

[75] Inventor: Hans-Detlef Brust, Dudweiler, Fed. Rep. of Germany

[73] Assignee: Siemens Aktiengesellschaft, Berlin and Munich, Fed. Rep. of Germany

[21] Appl. No.: 760,574

[22] Filed: Jul. 30, 1985

[30] Foreign Application Priority Data

Aug. 6, 1984 [DE] Fed. Rep. of Germany ....... 3428965

[51] Int. Cl.$^4$ ............................................. G01R 31/28
[52] U.S. Cl. ............................... 324/158 R; 324/73 R
[58] Field of Search ............. 324/158 R, 71.3, 73 PC, 324/73 R; 250/310, 311

[56] References Cited

U.S. PATENT DOCUMENTS

| 3,946,310 | 3/1976 | Saper et al. | 324/73 PC |
|---|---|---|---|
| 4,097,797 | 6/1968 | Finet | 324/73 R |
| 4,169,229 | 9/1979 | Feuerbaum . | |
| 4,220,853 | 9/1980 | Feuerbaum et al. . | |
| 4,220,854 | 9/1980 | Feuerbaum . | |
| 4,223,220 | 9/1980 | Feuerbaum . | |
| 4,277,679 | 7/1981 | Feuerbaum . | |
| 4,292,519 | 9/1981 | Feuerbaum . | |
| 4,358,732 | 11/1982 | Johnston et al. | 324/158 R |
| 4,413,181 | 11/1983 | Feuerbaum | 324/158 R |
| 4,477,775 | 10/1984 | Fazekas | 324/158 R |

OTHER PUBLICATIONS

Brust, H. D., et al.; "Frequency Tracing . . . "; Microcircuit Eng.; Academic Press, London; 1985; pp. 411–425.
Collin, J. P.; "Testing Complex . . . "; Une Alternative . . . ; 1983; pp. 283–298.
Feuerbaum, H. P.; "Electron Beam . . . "; Scanning; vol. 5; No. 1; 1983; pp. 14–24.
Scanning Electron Microscopy/1975 (Part 1), Proceeding of the Eighth Annual Scanning Electron Microscope Symposium IIT Research Institute, Chicago, IL 60616, Apr. 1975, Voltage Coding: Temporal Versus Spatial Frequencies, Lukianoff and Touw.

Primary Examiner—Ernest F. Karlsen
Attorney, Agent, or Firm—Hill, Van Santen, Steadman & Simpson

[57] ABSTRACT

A method and apparatus for detecting imaging measuring points which have a defined signal progression for testing an integrated circuit and wherein the signals at the measuring points have a defined signal progression and wherein a secondary particle signal is generated using a scanning particle microscope and which makes it possible to quickly locate a measuring point in an integrated circuit at which a defined signal is present or, respectively, assuming there are faults in the electronic modules to identify whether a defined signal has potentially failed and wherein the measured secondary particle signal is compared to the anticipated signal. The comparison can occur using a correlation method and the correlation can be accomplished with the assistance of an electronic correlator or also with the assistance of the particle beam itself. When the particle beam itself is used, the particle beam is modulated with the anticipated signal progression and the resulting secondary particle signal is integrated.

16 Claims, 2 Drawing Sheets

METHOD AND APPARATUS FOR DETECTING AND IMAGING MEASURING POINTS THAT HAVE A DEFINED SIGNAL PROGRESSION

BACKGROUND OF THE INVENTION

1. Field of the Invention

This invention relates in general to method and apparatus for detecting and imaging one or more measuring points which have a defined signal progression, as for example, in an integrated circuit.

2. Description of the Prior Art

When testing integrated circuits to locate faulty circuits it is desired to compare the characteristic of the integrated circuit to the rated characteristic so as to locate faults in the circuit. For this purpose, a check must be performed to see whether specific signal progressions are present at one or more measuring points within the integrated circuit.

There are five methods for making checks that have been disclosed by the prior art. The method of the so-called "voltage coding" is described in "Scanning Electron Microscopy" 1975 part I, Proceedings of the Eighth Annual Scanning Electron Microscope Symposium, Chicago, IIT Research Institute, Pages 465-471. The "voltage coding" method forms the dynamic voltage distribution of an integrated circuit on a video monitor. The "voltage coding" method enables a chronological allocation of the logic states of the various components and is therefore particularly suited for a fast function check of integrated circuits. The most serious disadvantge of this method is that it has a low upper limit frequency.

U. S. Pat. No. 4,223,220 discloses the so-called "logic state mapping". In such "logic state mapping" method, the dynamic voltage distribution is imaged with the assistance of a stroboscope effect. This "logic state mapping" method supplies a chronological resolution which is higher by orders of magnitude as compared to the "voltage coding" method given the same voltage resolution. The "logic state mapping" method also simplifies recording since the imaging of the dynamic voltage distribution can be photographed directly from the photo picture screen of a scanning electron microscope. In the "voltage coding" method by contrast a recording is only possible with a tape storage or with photos of a video monitor.

A third method which is disclosed in Feuerbaum, Electron Beam Testing Methods and Applications, Scanning, Vol. 5, 1983 pages 14–24 which is referred to as a "waveform" measurement, it is possible to measure the chronological signal progression as a measuring point. By means of employing a sampling method, this method makes it possible to also record extremely fast signal progressions with high chronological resolution. However, the measurement is extremely lengthy requiring several minutes and is relatively complicated.

It is also known with the assistance of two further methods to locate the measuring points which carry the periodic signals of specific frequencies. In the first of these methods, described in J. P. Collin in Proceedings of Jornées d'Electronique 1983, "Testing Complex Integrated Circuits: A Challenge", edited by the Swiss Federal Institute of Technology, Lausanne, Switzerland, Pages 283-298, Title: Une Alternative Economique au Contraste Potentiel Stroboscopique: Le Traitment du Signal d'Electrons Secondaires d'un Microscope a Balayage", the location of defined frequencies at a measuring point is executed upon employment of a "lock-in" amplifier. A signal having the sought-for frequency is thereby filtered out from a voltage contrast signal acquired at a measuring point inside an integrated circuit and is filtered out with the assistance of the "lock-in" amplifier and the intensity of this signal is then imaged as a brightness modulation. This method, however, is extremely slow and has a very low upper limit frequency.

When the last of the above described methods is combined with a stroboscopic imaging method, then the bandwidth limitation can be overcome. This modified method is disclosed in H. D. Brust, F. Fox, E. Wolfgang, Frequency Mapping and Frequency Tracing: Two Novel Electron Beam Testing Methods, Vortrag auf der Microcircuit Enginering Konferenz in Berlin, September, 1984 and is referred to as "frequency mapping" method. The "frequency mapping" method similar to the method of J. P. Collin will only allow a check to be performed as to whether a signal having a defined frequency occurs at a measuring point. It provides no information as to what the actual signal progression looks like.

The described methods disclosed by the prior art are difficult to implement and only allow the checking of a very few or of even a single interconnections are greatly limited in terms of their working frequency range and, thus, checking of integrated circuits is frequently not possible under normal operating conditions. Also, the methods known in the prior art are very slow and presume that the comparison of the measured and anticipated signal progression is manually undertaken or, respectively, that given signals having the same basic frequency require that an independent decision be made as to whether the anticipated signal progression is in fact present.

SUMMARY OF THE INVENTION

It is an object of the present invention to describe a method and apparatus for testing integrated circuits which allows testing to be quickly performed and to check whether a defined anticipated signal progression occurs at a measuring point inside of an integrated circuit or when faulty electronic components occur to identify whether a defined signal progression can occur.

The object of the invention is achieved in that the signal or respectively the progression is measured at the investigated measuring point. For example, with one of the known methods of electron beam testing and is compared to the anticipated signal or, respectively, to the progression thereof. The comparison can particularly occur by means of a correlation method. The development and advantages of the invention will be further understood when considering the specification and the drawings.

As compared to the methods of the prior art, the method of the invention is significantly faster and allows an automatic search for a defined prescribed or measured signal progression. Also, the method and apparatus of the invention thus allows a fast and large area implementation of a function check or respectively error search inside an integrated circuit even under normal operating conditions.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
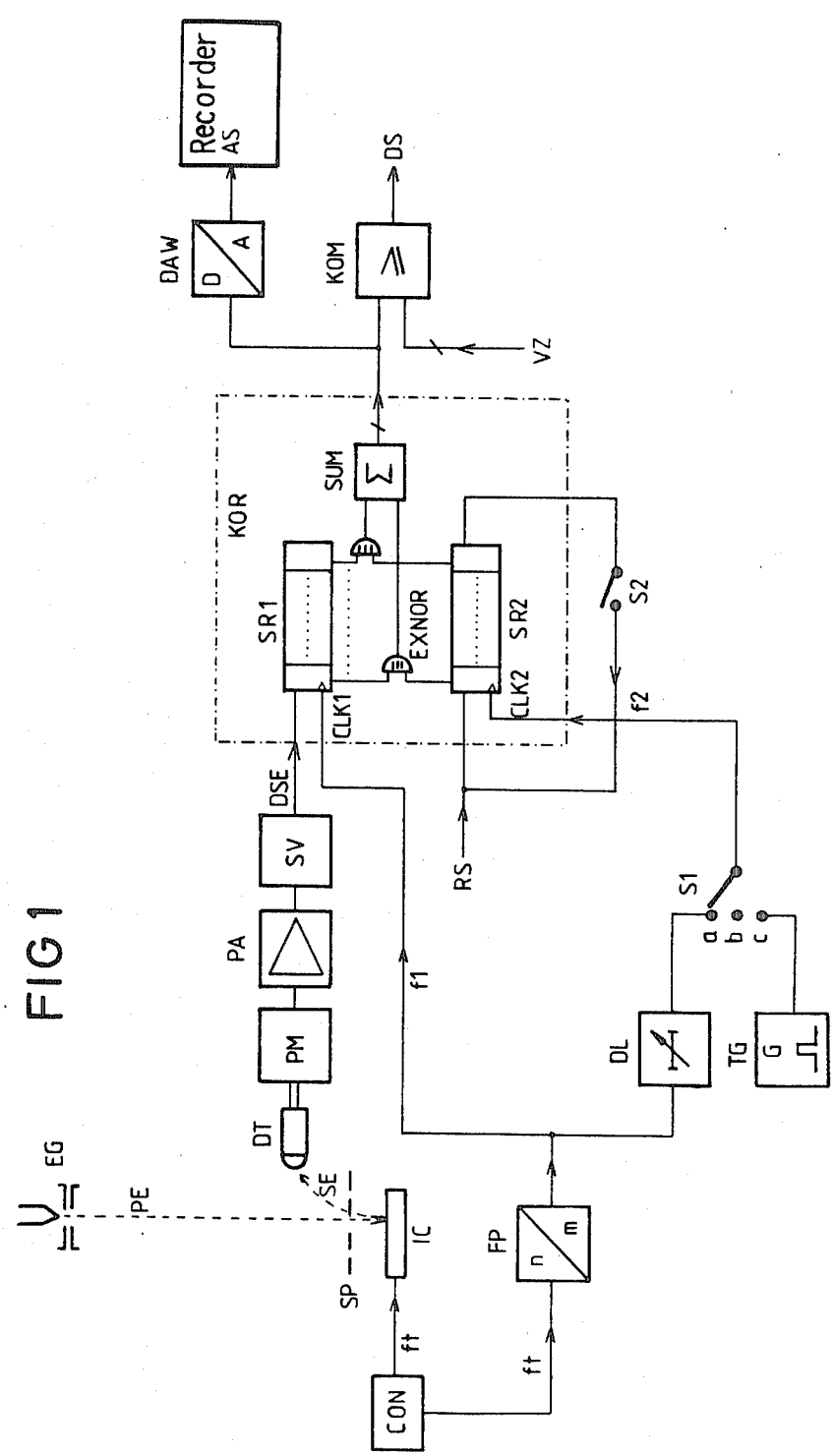
FIG. 1 is a block diagram illustrating the invention.
Figure 2:
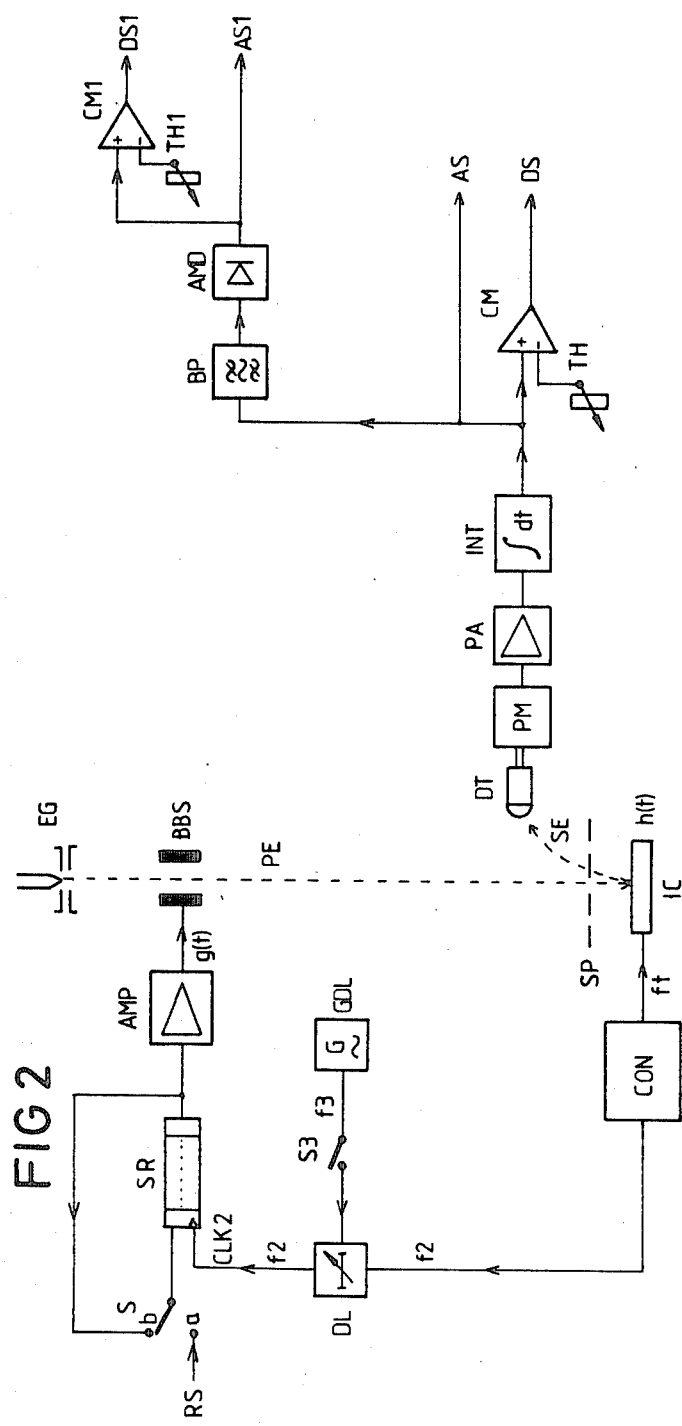
FIG. 2 is a block diagram illustrating a modification of the invention.

FIGS. 1 and 2 illustrate common elements which are identified with the same reference characters. Although the following exemplary embodiments refer to an electron microscope, the invention should be understood can be used with ions or other particles instead of electrons both as primary particles as well as secondary particles. Also digital signal progressions are always utilized in the following exemplary embodiments. Also, method and apparatus for the invention can be used to check a measuring point as the existance of a defined analog signal progression as long as a suitble correlator is utilized.

FIG. 1 illustrates an apparatus of the invention for detecting and/or imaging a measuring point or an interconnect which has a defined signal progression. In both FIGS. 1 and 2, a scanning electron microscope can be employed and such microscope may be such as known, for example, from U.S. Pat. Nos. 4,220,853, 4,220,854 or 4,277,679 for a quantitative voltage measurement and for a qualitative voltage measurement U.S. Pat. No. 4,223,220. In the apparatus of FIGS. 1 and 2, the integrated circuit IC can be replaced by any arbitrary specimen which comprises at least one measuring point which may possibly have a defined signal progression. Primary electrons PE are emitted from the electron source EG and impinge upon a measuring point or an interconnection within an integrated circuit IC and trigger secondary electrons SE. Such secondary electrons SE pass to and are detected by a detector DT. Due to the potential contrast occurring at the surface of the integrated circuit, the number of secondary electrons SE which are detected by the detector DT depends on the voltage of the integrated circuit IC at the measuring location. Depending on the secondary electron current which impinges on the detector DT, a secondary electron signal is generated by the detector DT. The output of the detector Dt is supplied to a photomultiplier PM where it is amplified. The secondary electron signal which has been amplified in the photomultiplier is supplied to a pre-amplifier PA where it is further amplified and is then supplied to a circuit SV in which it is subjected to a suitable signal processing for enhancing the signal to noise ratio (for example an optimum filter) and is converted into an exclusively digital signal DSE. Such digital secondary electron signal indicates the voltage of the integrated circuit at the measuring location and is then supplied to the digital correlator KOR.

The illustrated internal structure of the correlator KOR is largely based on the structure of the correlator TDC model 1023J of the TRW Corporation. Other correlators can also be used in the invention. First, the anticipated reference signal RS which is to be checked to see whether it appears at the measuring location is read into the shift register SR2. The clock signal required for this purpose is supplied by the clock generator TG with the switch S1 being in position c. After the read in of the reference signal RS, the switch S1 is moved to switch position b and as a consequence the shift register SR2 with this reference signal RS is separated from the output of the clock generator TG. The content of the shift register SR2 remains unaltered during the execution of the check.

During the measurement, the secondary electron signal DSE is continuously sensed with the frequency f1 and is read into the shift register SR1. The clock signal CLK1 having the frequency f1 should therefore be synchronous with the operating frequency of the integrated circuit. It can, for example, be acquired by means of frequency division or multiplication using a frequency divider or multiplier FP which receives the clock frequency ft of the integrated circuit IC. Since the integrated circuit IC is driven by the controller CON with a clock frequency having the frequency of ft this frequency is readily accessible and can be supplied from the controller CON to the frequency divider or multiplier FP as illustrated in FIG. 1. Fundamentally, however, any signal synchronous with the signal next to the measuring point is suitable as a clock signal CLK1 for the shift register SR1. The frequency f1 must be selected such that an adequately large time interval of the signal progression at the measuring point can be stored in the shift register SR1 and this must be at least as large as the time interval occupied by the anticipated signal progression. Using the coincidence elements EXNOR, the memory contents of the shift registers SR1 and SR2 are checked for coincidence. The number of coinciding memory locations of the shift register SR1 and SR2 is identified with the use of the summation circuit SUM and the output of such circuit is a binary number. Such binary numbers can be subsequently converted into an analog signal AS using the digital to analog converter DAW or, alternatively, can be compared to a comparison number VZ using a digital comparator KOM. When the number of coincidences is greater than VZ, then the digital output DS of the comparator KOM changes to logic 1 otherwise it is logic 0.

When thus a bit sequence corresponding to the reference signal RS read into the comparison shift register SR2 appears at any time in the sensed secondary electron signal DSE, then the summation circuit indicates maximum coincidence and the output DS is changed to logic 1 and the analog output As assumes its maximum output voltage value. Since the measured secondary electron signal DSE can easily deviate from the signal at the measuring point due to noise or due to other disruptions under given conditions it may be desirable to assume that the desired reference signal RS is present although there is no complete coincidence and there is nonetheless a high grade coincidence between the reference signal RS and the measured signal DSE. The corresponding threshold, in other words, the number of coincidences which is required so as to interpret the measured signal as the sought-for bit sequence can be set by adjusting the comparison number VZ.

In the described apparatus of FIG. 1 a check is performed to see whether the prescribed signal progression RS appears at the measuring location. In addition, insofar as a periodic signal is anticipated at the measuring location, a check can also be performed in a further development of the invention to see whether the anticipated signal RS appears at the measuring location at a defined fixed phase. Such apparatus is also shown in FIG. 1. For this purpose, the shift register SR2 is electrically connected to the reference signal RS by closing the switch S2 to form a ring shift register and is also clocked with the signal CLK1 with the switch S1 being in switch position a. The phase at which the check is to be formed to see whether the anticipated reference signal is next to the measuring location can be shifted by changing the delay time of delay element DL. Otherwise the measuring device operates in the same fashion as described previously.

For a large area check of an integrated circuit IC, the electron beam PE is scanned across the spectrum surface of the integrated circuit. The scanning must thereby occur so slowly that a check can be performed at every measuring location at a time in which the anticipated signal can appear-that is, for example, one period given periodic signals-or, on the other hand, the check must be periodically undertaken. The output signals As and DS then indicate whether the signal progression occurs at all or, respectively, whether it occurs in proper phase at the location which is hit by the electron beam. When the signals As or DS are recorded depending on the measuring location using a suitable recording method as, for example, by reading it into a computer or by storing on a magnetic tape, then an image of the surface structures of the specimen integrated circuit which carry the sought-for signal progression (at all or in phase). A simple recording possibility comprises employing the signal DS for the brightness modulation of the picture tube of a scanning electron microscope. In this instance, all interconnections which carry the sought-for signal will be brightly presently. For better orientation in the two dimensional image of a specimen, it can be advantageous to add the secondary electron topography signal or some other topography signal to the output signal As or DS in attenuated form. The method and apparatus for obtaining a topography signal is well known and is discussed in text books describing scanning electron microscopes.

When in the arrangement of FIG. 1, a plurality of correlators are connected in parallel then the presence of a plurality of different signal progressions can be simultaneously checked for one measuring location. For this case, the various output signals must be recorded in parallel depending on the measuring location for the large area checking of an integrated circuit IC. For this purpose, for instance, the picture tube of the scanning electron microscope can be replaced by a color picture tube and every correlator output and, thus every reference signal progression can have a different color allocated to it.

The above-described measuring apparatus and techniques are not well suited for the investigation of analog signals, since the interrelationship between the voltage at the measuring location and secondary electron current is non-linear due to the voltage contrast. For the investigation of analog signal progressions, it is desirable to replace the voltage contrast by the linear energy shift of the secondary electrons SE. Using a spectrometer SP as described, for example, in U.S. Pat. No. 4,292,519, this energy shift can be converted into a corresponding secondary electron current. The secondary electron current obtained in this manner can then be further processed in the same fashion as described above. Also, a spectrometer reduces the disturbing influence due to local fields on the specimen and is also advantageous for the investigation of digital signal progression.

The limiting frequency of the measuring installation illustrated in FIG. 1 is essentially determined by the detector DT and generally lies in the range of 1 through 5 MHz. So as to be able to use the method of the invention at higher frequencies, the correlation can be undertaken before the detector DT. FIG. 2 illustrates such an apparatus. Here the correlation is undertaken by the electron beam itself. For this purpose, the electron beam PE is intensity modulated with the use of a beam modulating system BBS as disclosed, for example, in U.S. Pat. No. 4,169,229. sought-for bit sequence RS sensed with the frequency f2 synchronous with the operating frequency of the integrated circuit IC is read into the shift register SR before the beginning of the measurement with the switch S in position a. During the measurement, the content of the shift register SR is cyclically shifted by the clock signal CLK2 which has a frequency f2. The output signal of the shift register is amplified by an amplifier AMP and then controls the beam modulating system BBS. When the signal progression at the beam modulating system is defined as g(t), then the intensity of the primary electron beam PE varies proportionally to g(t). The signal h(t) is next to the measuring location on the integrated circuit IC. The secondary electron current is therefore proportional to g(t)*h(t). The secondary electron current is detected by the detector DT and is amplified in the photomultiplier PM and in the pre-amplifier PA. The output signal of the pre-amplifier PA is then integrated by the integrator INT. The output signal of the integrator is proportional to $\int g(t)*h(t)*dt$. Since g(t) and h(t) are both digital signals they can only assume the values of 0 or 1. When both signals coincide in the integration span in the low or respectively high values in the bit sequence and in the phase of appearance, then the value of the integral becomes maximum. The output signal of the integrator INT is thus a measure of the coincidence of the signal at the measuring location and of the reference signal RS. The integration time of the integrator must therefore be at least as great as the duration of the signal progression which is under consideration.

When a large area of the integrated circuit IC is to be checked, then the scanning of the specimen surface by the electron beam must occur so slowly that the beam dwells at every measuring point at least for the integration time or, on the other hand, the check must be periodically undertaken. The analog output signal AS of the integrator INT can then be recorded and, for example, be displayed on a picture screen as a component of the scanning electron microscope utilized for the apparatus of FIG. 2. For contrast enhancement, the signal As can also be applied to the input of a comparator CM which also receives an input from a variable response threshold TH which can be set to various levels. The comparator CM converts the analog signal AS into a digital signal DS which can also control the brightness of picture tube. With such measuring installation, the employment of a spectrometer can also be advantageous for the reasons mentioned above. Under certain conditions an integrator can be omitted because for higher frequencies the detector DT and for low frequencies the picture tube of the scanning electron microscope have an integrating effect when a suitable selection of the scan speed is made.

In the arrangement described up to this point, the apparatus of FIG. 2 checks to see whether a defined signal progression occurs in proper phase at the measuring point under investigation. The phase at which this is investigated can be shifted by modifying the delay time of the delay element DL. The upper limit frequency of the measuring installation is defined by the beam modulating system BBS which is utilized. Beam modulating systems which operate up to the GHz range, are presently available. Such apparatus and method of the invention can therefore be utilized for inspecting integrated circuits under real operating conditions.

It is also possible with the arrangement of FIG. 2 to execute checks to see whether a defined signal progression is present at the measuring location independently of the phase. For this purpose, the delay element DL which must now be electronically controlled is driven by a generator GDL having a frequency of f3. A delay line comprising a plurality of taps which may be a so-called "tapped delay line" can, for instance, be employed as the delay element DL. The output of this delay line is connected to the shift register SR through a multiplexer controlled by an analog to digital converter. When 2*Dt is the total delay of the delay element VZ, then the clock signal CLK2 is delayed $Dt*(1+\cos(2\pi f3))$. The primary electron current is thus proportional to $g(t+Dt*(1+\cos(2\pi f3)))$.

When the integration time of the integrator INT is significantly shorter than the period of duration $\frac{1}{2}\pi f3$ during which the primary electron current is modulated, then the output signal of the integrator INT periodically fluctuates at the frequency f3 when the reference bit sequence and the signal adjacent to the measuring location coincide. When there are only a few coincidences, then the integrator output supplies a nearly time-independent means signal value. The amplitude of the signal fluctuation at the frequency f3 at the integrator output is therefore a measure of the coincidence of the two bit sequences. For measuring the coincidience, the signal components of the frequency f3 at the output of the integrator are filtered with the assistance of a bandpass filter BP which has a center frequency of f3 and then the amplitude is determined using an amplitude demodulator AMD which may be an envelope demodulator, for example. The analog output signal AS1 of the amplitude demodulator indicates the degree of coincidence of the two bit sequences. The signal AS1 can also be converted using a comparator CM1 with the variable threshold TH1 into a digital signal DS1 for contrast enhancement. Both signals just like the signals As and DS can be recorded and displayed. When the integration time of the integrator INT is longer than the period duration $\frac{1}{2}\pi f3$, then the signals As and DS are direct measure for the coincidence of the signal at the measuring location and of the reference bit sequence. In this case, however, the signal to noise ratio is significantly poorer. For the reasons mentioned above, the employment of a spectrometer SP can also be advantageously utilized with the method and apparatus of FIG. 2.

According to a further development of the invention rather than modulating the primary electron beam PE, the secondary electron current beam SE can be modulated with a reference bit sequence RS in contrast to the measuring installations described above. An retarding field spectrometer as disclosed in U. S. Pat. No. 4,292,519 serve as the modulator when the retarding field of the spectrometer is controlled by the reference bit sequence. Otherwise such measuring installation corresponds to that shown in FIG. 2. The advantage of this method is that no beam modulating system BBS is required. However, the obtainable limit frequency is also lower because of the relatively high capacitance of a spectrometer. A detector which has its extraction voltage controlled by the reference bit sequence can also serve for the modulation of the secondary electron beam.

According to a further development of the invention, the secondary electron signal is modulated with the reference bit sequence instead of the primary electron beam and it may be modulated for instance using a gate circuit.

In a manner similar to that described with reference to FIG. 1, it may also be advantageous in the circuits described above to add the secondary electron topography signal or some other topography signal to the respective output signal so as to improve the orientation in the two dimensional imaging of a specimen.

In the apparatus and method of the invention, the sought-for reference signal RS definitely need not only be acquired in a theoretical manner from simulation. It can also be measured with one of the known methods of electron beam testing at a measuring point inside the integrated circuit IC and can then be read into the shift register SR2 or the shift register SR illustrated in FIG. 2.

Also, the secondary electron signal at the measuring location need not necessarily occur due to voltage contrast. Any other influence of the secondary electron current by the signal at the measuring location is suitable for this purpose. An example of such alternative is the influence of the secondary electrons by magnetic fields (magnetic contrast). This, for example, can be utilized when magnetic bubble memories are used as the specimen integrated circuit IC.

Although the invention has been described with respect to preferred embodiments, it is not to be so limited as changes and modifications can be made which are within the full intended scope of the invention as defined by the appended claims.

I claim as my invention:

1. A method for the documentation and imaging of measuring points at which a defined, time-dependent signal progression is present, comprising the steps of;: bombarding at least one measuring point of a specimen with a primary particle beam;, detecting the secondary particles triggered at the measuring point by the primary particle beam, deriving a second signal from the secondary particle signal; checking to see whether the second signal has approximatly the same time-dependency progression as said defined signal within a prescribed time range; and generating a first output signal that specifies the degree of coincidence between said second signal has approximately the same time-dependscribed time range.

2. The method according to claim 1 comprising the steps of digitizing said second signal and reading it into a first memory; digitizing said defined signal and reading it into a second memory; and comparing the coincidence of said two signals by comparing the contents of the memory locations in which they are stored.

3. The method according to claim 2, characterized in that the coincidence of the time-dependency of the signals is checked independently of phase.

4. The method according to claim 2, characterized in that the coincidence of the time-dependency of the signals is checked depending on phase.

5. The method according to claim 2, characterized in that said first output signal is compared to a threshold;

and in that the result of said comparison defines a second output signal.

6. The method according to claim 2, characterized in that said primary particle beam scans at least a part of the specimen surface; and the first output signal is registered dependent on the location of said primary particle beam on said specimen surface.

7. The method according to claim 6, characterized in that said first output controls the intensity of a write beam of a visual display that is deflected in sychronization with said primary particle beam.

8. The method according to claim 1, characterized in that only secondary particles having energies above a threshold are detected.

9. A method according to claim 1, characterized in that a comparison is made by a correlation method.

10. A method according to claim 1, comprising supplying the measuring signal, after signal processing for improving the signal-to-noise ratio and/or for signal shaping, to a correlator (KOR).

11. A method according to claim 1 comprising scanning the beam of primary particles (PE) over the entire specimen surface or an individual measuring point or a group of measuring points once or repeatedly.

12. A method according to claim 1 comprising also recording a topography signal.

13. A method according to claim 1 comprising recording a output signal and, the topography signal with a recording medium such as a picture tube, a plotter or a computer.

14. A method according to claim 1 comprising measuring the anticipated reference signal.

15. A method according to claim 1 comprising forming a new signal from the measured secondary particle signal.

16. A method according to claim 15, wherein comparison occurs by a correlation method.

* * * * *